(12) United States Patent
Ito et al.

(10) Patent No.: US 8,386,886 B2
(45) Date of Patent: *Feb. 26, 2013

(54) METHOD, SYSTEM, AND APPARATUS FOR DISTRIBUTED DECODING DURING PROLONGED REFRESH

(75) Inventors: Yutaka Ito, Tokyo (JP); Takuya Nakanishi, Ibaraki (JP)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/273,765

(22) Filed: Oct. 14, 2011

(65) Prior Publication Data

US 2012/0036411 A1 Feb. 9, 2012

Related U.S. Application Data

(63) Continuation of application No. 11/716,199, filed on Mar. 8, 2007, now Pat. No. 8,042,022.

(51) Int. Cl.
*G11C 29/00* (2006.01)

(52) U.S. Cl. ..................................... 714/764

(58) Field of Classification Search ................... 714/764
See application file for complete search history.

(56) References Cited

U.S. PATENT DOCUMENTS

| | | | |
|---|---|---|---|
| 5,517,634 A * | 5/1996 | Ehrlich ................... | 711/166 |
| 5,918,242 A | 6/1999 | Sarma et al. | |
| 5,978,952 A | 11/1999 | Hayek et al. | |
| 6,426,908 B1 | 7/2002 | Hidaka | |
| 6,438,057 B1 | 8/2002 | Ruckerbauer | |
| 6,510,528 B1 | 1/2003 | Freeman et al. | |
| 6,549,479 B2 | 4/2003 | Blodgett | |
| 6,560,155 B1 | 5/2003 | Hush | |
| 6,560,733 B1 | 5/2003 | Ochoa | |
| 6,587,918 B1 | 7/2003 | Christenson | |
| 6,697,992 B2 | 2/2004 | Ito et al. | |
| 6,735,726 B2 | 5/2004 | Muranaka et al. | |
| 6,795,362 B2 | 9/2004 | Nakai et al. | |
| 6,838,331 B2 | 1/2005 | Klein | |
| 6,839,875 B2 | 1/2005 | Roohparvar | |
| 6,930,944 B2 | 8/2005 | Hush | |
| 6,990,031 B2 | 1/2006 | Hashimoto et al. | |
| 7,010,644 B2 | 3/2006 | Gilton | |
| 7,051,260 B2 | 5/2006 | Ito et al. | |
| 7,072,237 B2 | 7/2006 | Morgan et al. | |
| 7,076,722 B2 | 7/2006 | Shibata | |
| 7,123,534 B2 | 10/2006 | Nambu et al. | |
| 7,139,919 B2 | 11/2006 | Shiraga | |
| 7,139,937 B1 | 11/2006 | Kilbourne et al. | |
| 7,325,078 B2 | 1/2008 | Walker et al. | |
| 7,328,380 B2 | 2/2008 | Pomaranski et al. | |
| 7,386,656 B2 | 6/2008 | Rajan et al. | |
| 7,392,456 B2 | 6/2008 | Leung et al. | |
| 7,428,644 B2 | 9/2008 | Jeddeloh et al. | |
| 7,487,065 B2 | 2/2009 | Armstrong et al. | |
| 7,493,531 B2 | 2/2009 | Ito et al. | |
| 7,496,823 B2 | 2/2009 | Wheeler et al. | |
| 7,712,007 B2 | 5/2010 | Nagai et al. | |

(Continued)

*Primary Examiner* — Stephen M Baker
(74) *Attorney, Agent, or Firm* — TraskBritt

(57) ABSTRACT

Methods, apparatuses and systems are disclosed for preserving, verifying, and correcting data in DRAM device during a power-saving mode. In the power-saving mode, memory cells in the DRAM device may be refreshed using a self-refresh operation. This self-refresh operation may allow bit errors to occur in the DRAM device. However, by employing error correction coding (ECC), embodiments of the present invention may detect and correct these potential errors that may occur in the power-saving mode. Furthermore, a partial ECC check cycle is employed to check and correct a sub-set of the memory cells during a periodic self-refresh process that occurs during the power-saving mode.

31 Claims, 6 Drawing Sheets

U.S. PATENT DOCUMENTS

| | | |
|---|---|---|
| 7,755,966 B2 | 7/2010 | Pyo et al. |
| 7,830,732 B2 | 11/2010 | Moshayedi et al. |
| 2003/0067830 A1 | 4/2003 | Leung et al. |
| 2004/0205426 A1 | 10/2004 | Muranaka et al. |
| 2005/0063238 A1 | 3/2005 | Nambu et al. |
| 2005/0286330 A1 | 12/2005 | Ito et al. |
| 2006/0200729 A1 | 9/2006 | Ito et al. |

* cited by examiner

METHOD, SYSTEM, AND APPARATUS FOR DISTRIBUTED DECODING DURING PROLONGED REFRESH

CROSS-REFERENCE TO RELATED APPLICATION

This application is a continuation of U.S. patent application Ser. No. 11/716,199, filed Mar. 8, 2007, now U.S. Pat. No. 8,042,022 issued Oct. 18, 2011, the disclosure of which is incorporated herein by this reference in its entirety.

FIELD OF THE INVENTION

Embodiments of the present invention relate to semiconductor devices. More particularly, embodiments of the present invention relate to error detection and correction in Dynamic Random Access Memory (DRAM) devices.

BACKGROUND OF THE INVENTION

Modern computers and other digital systems rely on semiconductor memory devices to store data and instructions for processing by a central processing unit (CPU). Most of these systems have a system memory, which usually includes Dynamic Random Access Memory (DRAM) devices. The memory storage cost per bit for DRAM devices is relatively low because a DRAM memory cell needs relatively few circuit components to store a data bit as compared with other types of memory cells, such as Static Random Access Memory (SRAM) devices or Flash memory devices. Thus, a high capacity system memory can be implemented using DRAM devices for a relatively low cost.

Although DRAM devices have the advantage of providing relatively low-cost data storage, they generally consume more power. In fact, DRAM devices used in a digital system, such as a computer, can consume a significant percentage of the total power consumed by the system. The power consumed by computers and other digital systems can be a critical factor in their utility in certain applications. For example, the power consumed by portable personal computers greatly affects the length of time they can be used without the need to recharge batteries powering such computers. Power consumption can also be important even where memory devices are not powered by batteries because it may be necessary to limit the heat generated by the memory devices.

Furthermore, as is well known in the art, DRAM memory cells must be periodically refreshed to retain data stored in the DRAM device by restoring the charge on each bit. This refresh operation tends to consume power at a substantial rate. Refresh is typically performed by activating each row of memory cells in an array, which essentially reads data bits from the memory cells in each row and then internally writes those same data bits back to the same cells in the row. This refresh is generally performed at a rate needed to keep charge stored in the memory cells from leaking excessively between refreshes. Since refresh involves accessing data bits in a large number of memory cells at a rapid rate, refresh tends to be a particularly power-hungry operation. Thus many attempts to reduce power consumption in DRAM devices have focused on reducing the rate at which power is consumed during refresh.

The amount of power consumed by refresh also depends on which of several refresh modes is active. A self-refresh mode is normally active during periods when data are not being read from or written to the DRAM device. Since many electronic devices, such as notebook computers, are often inactive for substantial periods of time, the amount of power consumed during self-refresh can be an important factor in determining how long the electronic device can be used after a battery charge. While power is also consumed at a significant rate during other refresh modes when the DRAM device is active, the DRAM device is consuming power at a significant rate anyway while the data stored therein are being accessed. Therefore, if the power consumption during self-refresh can be reduced, the rate of power consumption dedicated to refresh operations can be significantly reduced.

Furthermore, DRAM devices have been proposed with prolonged low power modes (often referred to as "sleep modes") for maintaining the data in the DRAM when the DRAM is not being externally accessed for a relatively long period of time. During the sleep modes, the DRAM may return to an intermediate power level to perform the required periodic refresh cycles.

Another method for reducing power consumption in DRAMs is to modify the refresh period as a function of temperature. The rate at which charge leaks from a DRAM memory cell increases with temperature. The refresh rate must be sufficiently high to ensure that no data is lost at the highest temperature in the specified range of operating temperatures of the DRAM device. Yet, DRAM devices normally operate at temperatures that are substantially lower than their maximum operating temperature. Therefore, DRAM devices are generally refreshed at a rate that is higher than the rate actually needed to prevent data from being lost, and, in doing so, unnecessarily consume power. To address this problem, some commercially available DRAM devices allow the user to program a mode register to select a lower maximum operating temperature. The DRAM device then adjusts the refresh rate to correspond to the maximum operating temperature selected by the user. Although adjusting the refresh rate to correspond to a lower maximum operating temperature does reduce the rate of power consumed during refresh, it nevertheless still allows power to be consumed at a significant rate. If the refresh rate was reduced beyond a safe limit, at least some of the memory cells might not be refreshed before that data stored therein was lost. Data subsequently read from the DRAM device would then contain erroneous data bits.

BRIEF DESCRIPTION OF THE DRAWINGS

In the drawings, which illustrate embodiments of the invention.

DETAILED DESCRIPTION OF THE INVENTION

Figure 1:
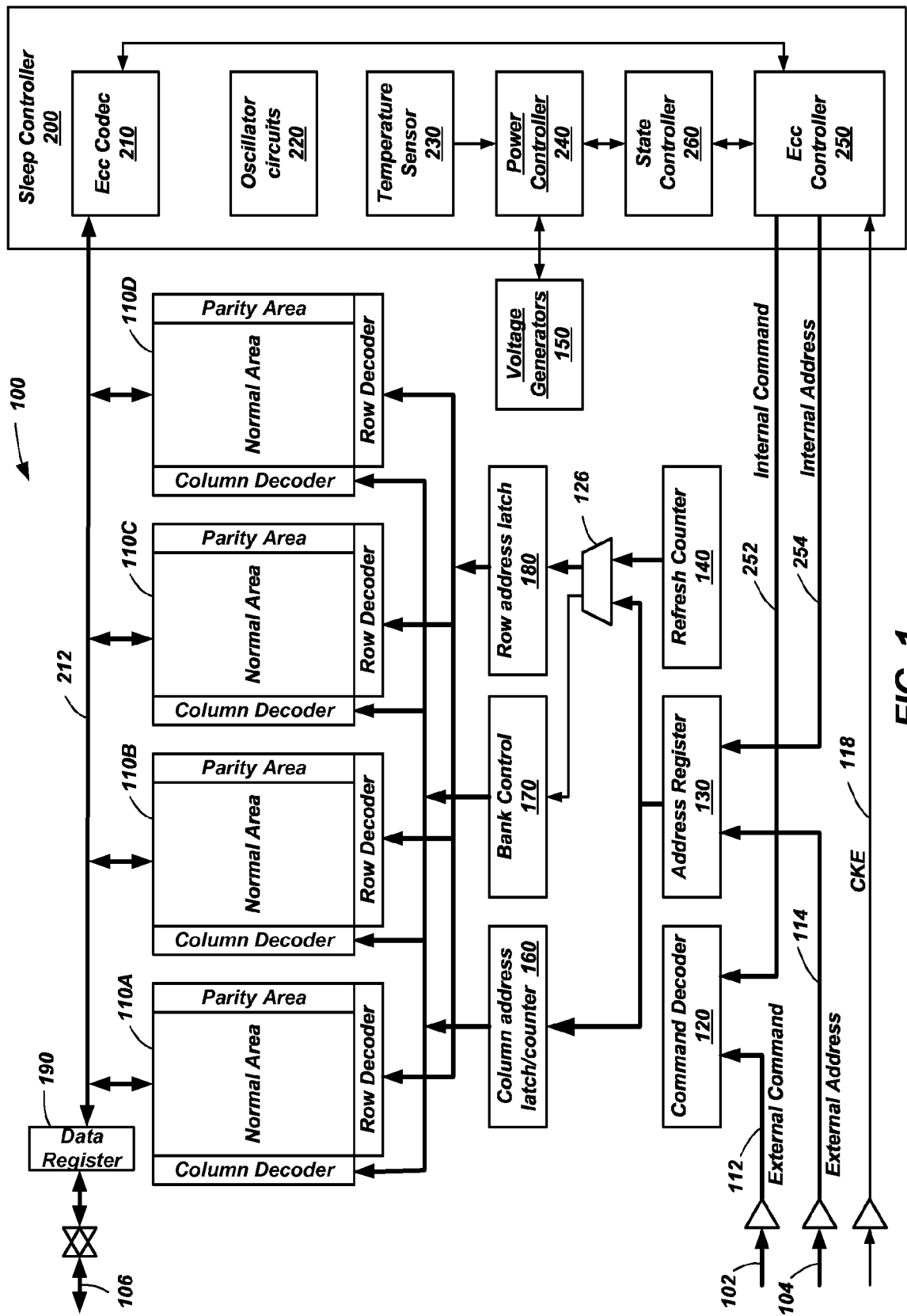
FIG. 1 is a simplified block diagram of a DRAM device in accordance with an embodiment of the present invention.

Embodiments of the present invention comprise methods, devices, and systems for providing enhanced ways to detect and correct potential data errors in a DRAM that may occur during prolonged low power modes of the DRAM. Embodiments of the present invention preserve, verify, and correct data in a DRAM device during a power-saving mode. In the power-saving mode, memory cells in the DRAM device may be refreshed at a rate that is less than the normally specified rate for high temperature operation. This lower refresh rate may allow bit errors to occur in the DRAM device. However, by employing error correction coding (ECC), embodiments of the present invention can detect and correct these potential errors that may occur in the power-saving mode. Furthermore, partial ECC cycles are employed to check and correct a sub-set of the memory cells as part of a periodic self-refresh process that occurs during the power-saving mode.

In the following detailed description, reference is made to the accompanying drawings which form a part hereof, and in which is shown by way of illustration specific embodiments in which the invention may be practiced. These embodiments are described in sufficient detail to enable those of ordinary skill in the art to practice the invention, and it is to be understood that other embodiments may be utilized, and that structural, logical, and electrical changes may be made within the scope of the present invention.

In this description, circuits and functions may be shown in block diagram form in order not to obscure the present invention in unnecessary detail. Furthermore, specific circuit implementations shown and described are only examples and should not be construed as the only way to implement the present invention unless specified otherwise herein. Block definitions and partitioning of logic between various blocks represent a specific implementation. It will be readily apparent to one of ordinary skill in the art that the present invention may be practiced by numerous other partitioning solutions. For the most part, details concerning timing considerations and the like have been omitted where such details are not necessary to obtain a complete understanding of the present invention and are within the abilities of persons of ordinary skill in the relevant art.

Some drawings may illustrate signals as a single signal for clarity of presentation and description. It will be understood by a person of ordinary skill in the art that the signal may represent a bus of signals, wherein the bus may have a variety of bit widths and the present invention may be implemented on any number of data signals including a single data signal. Furthermore, the terms "assert" and "negate" are respectively used when referring to the rendering of a signal, status bit, or similar apparatus into its logically true or logically false state. These logic states may not directly correspond to specific voltage levels on the signal. In other words, an asserted state may refer to a logic signal carrying a low voltage. Similarly, if the logically true state is a logic level one, the logically false state will be a logic level zero. Conversely, if the logically true state is a logic level zero, the logically false state will be a logic level one.

The terms "wafer" and "substrate" are to be understood as a semiconductor-based material including silicon, silicon-on-insulator (SOI) or silicon-on-sapphire (SOS) technology, doped and undoped semiconductors, epitaxial layers of silicon supported by a base semiconductor foundation, and other semiconductor structures. Furthermore, when reference is made to a "wafer" or "substrate" in the following description, previous process steps may have been utilized to form regions or junctions in or over the base semiconductor structure or foundation. In addition, the semiconductor need not be silicon-based, but may be based on silicon-germanium, silicon-on-insulator, silicon-on-sapphire, germanium, or gallium arsenide, among others.

FIG. 1 is a simplified block diagram of an embodiment of a DRAM device 100 in accordance with the present invention. The DRAM device 100 may be any suitable DRAM, such as, by way of non-limiting example, a Synchronous DRAM (SDRAM). The DRAM device may include multiple arrays 110 of memory bits illustrated as arrays 110A, 110B, 110C, and 110D. The memory bits may be configured with a normal area for storing information bits (also referred to as data bits) and a parity area for storing parity bits (also referred to as check bits). The desired bits are read from, or written to, the memory banks by presenting the appropriate column address, row address and control signals to the memory banks as is well known in the art. Of course other configurations of the memory bits and partitioning between the information bits and the check bits are contemplated within the scope of the present invention. For example, the information bits may be stored in one or more arrays 110 with the check bits stored in one or more different arrays 110.

In discussing the DRAM device 100 of FIG. 1, reference will be made to two specific modes of operation. Normal operation refers to conventional operation of the DRAM device 100 wherein it receives and executes commands from the signal pins. Sleep-mode operation refers to an operating mode wherein the DRAM device 100 operates under a low-power mode wherein it may not accept most conventional commands from the signal pins, except for a command to exit sleep mode. This sleep mode may also be referred to as a low-power mode or a data-retention mode. Of course, other operation modes may occur on the DRAM device 100 but need not be described herein with respect to embodiments of the present invention.

Under normal operation of the DRAM device 100, commands may be input on command inputs 102, conveyed across an external command bus 112, and decoded by a command decoder 120 to determine the various commands that the DRAM device 100 may perform. Similarly, a target address may be input on address inputs 104 and conveyed across an external address bus 114 to be held in an address register 130. It should be noted that the external command bus 112 and the external address bus 114 are internal buses and are named "external" to note that the commands and addresses originate from outside the DRAM device 100 and to distinguish them from an internal command bus 252 and an internal address bus 254, which are discussed later. Furthermore, while FIG. 1 does not illustrate signals leaving the command decoder 120, those of ordinary skill in the art will recognize that the command decoder 120 may include a variety of signals to control various functional blocks and general DRAM device 100 operations based on the commands to be performed.

For normal write cycles, data bits may be input from data Input/Output signals 106 and held in a data register 190, where the data may be conveyed on a data bus 212 to the arrays 110. Conversely, for read cycles, data bits may be read from the arrays 110, conveyed on the data bus 212, and held in the data register 190 for output on the data I/O signals 106 at the proper time.

A command decoder accepts commands from either the external command bus 112 or an internal command bus 252. While not illustrated, those of ordinary skill in the art will recognize that the command decoder may control many different elements and operations within the DRAM device 100. An address register accepts addresses from an external address bus 114 or an internal address bus 254.

A refresh counter 140 may be configured to generate proper refresh addresses for the arrays 110 based on an external command, an internal command, or self-refresh operations. Based on the command being executed, the address register 130 or the refresh counter 140 may provide an address to the arrays 110. Based on whether a normal access or a refresh is being performed, a portion of the address is transferred to a column address latch/counter for presentation to the column decoders of the arrays 110. A portion of the address may be fed through a multiplexer 126 to provide the proper address signals to a bank control 170 block and a row address latch 180.

Under sleep mode operation, the DRAM device 100 may operate to perform self-refresh cycles, perform error correction operations, and control power to various elements on the DRAM device in an effort to reduce power consumption during the sleep mode while still retaining the data stored in the arrays 110.

Furthermore, this sleep mode operation may perform refresh operations at a rate that is less than the minimum specified rate for the DRAM device 100. As is known in the art, the rate at which charge leaks from DRAM memory cells increases with temperature. Therefore, the minimum specified refresh rate is generally specified at a maximum operating temperature. However, the DRAM device 100 may not be operating at a maximum operating temperature, particularly when the DRAM device 100 is in the sleep mode. Therefore, a temperature sensor 230 may be included such that the refresh rate may be modified as a function of the temperature to provide enhanced power savings without permitting excessive data errors. This adjusted refresh rate is often referred to as Auto Temperature Compensated Self Refresh (ATCSR).

In addition, DRAM bits have been shown to have a Variable Retention Time (VRT) based on how long a memory cell can retain information because memory cell leakage can vary with time. Thus, VRT bits become an increasing problem when the time period between refreshes is increased.

The ATCSR along with the VRT bits may allow soft bit errors to occur during the sleep mode. Embodiments of the present invention include error correction operations to detect and correct these potential errors. Parity generation and detection is well known in computing systems. Unfortunately, while parity allows for the detection of single bit errors, it does not provide a means of determining which bit is in error. Therefore, there is no mechanism for correcting an error once it has occurred. An Error Correcting Code (ECC), on the other hand, extends the capabilities of conventional parity checking by generating a code that can not only detect bit errors, but also identify which bit or bits contain errors. Some example ECCs that may be used in embodiments of the invention are Hamming code, Bose, Ray-Chaudhuri, Hocquenghem (BCH) code, Reed-Solomon code, Reed-Muller code, Binary Golay code, convolutional code, and turbo code.

In ECC systems, each data bit contributes to more than one ECC bit. ECC bits may also be referred to herein as check bits or parity bits. It should be understood that unless stated otherwise, parity and parity bits do not refer to bits within a parity system only capable of detecting errors. Rather, parity and parity bits refer to bits within an ECC system capable of detecting and correcting errors.

By carefully defining which data bits contribute to which check bits, it becomes possible to not just detect a single-bit error, but to actually identify which bit is in error, even if it is one of the check bits. Simple ECC systems are designed so that single-bit errors can be corrected, and double-bit errors can be detected but not corrected. More complex ECC systems may be capable of correcting multiple bits within a data segment.

As an example, a simple ECC system may be configured with a 64-bit data word, and 7 check bits. Each check bit may be calculated as the parity of a different subset of the data bits. The check bits may be computed by a set of exclusive-OR trees based on the 64-bit word. When the word is read back, the exclusive-OR trees use the data read from the memory to re-compute the ECC. The recomputed ECC is compared to the check bits read from the memory. Any discrepancy indicates an error. By looking at which check bits don't match, it is possible to identify which data or check bit is in error, or whether a double-bit error occurred. This comparison may be done by an exclusive-OR of the read and recomputed ECC bits. The result of this exclusive-OR combining the data bits and check bits is often called a syndrome. If the syndrome is zero, no error occurred. If the syndrome is non-zero, it can be used to determine which bits are in error, or that the error is uncorrectable.

In a more complex embodiment of the present invention, the data segment may be defined as a single row of an array. As a non-limiting example, in any array of 512 Mb, a data segment may be 2048 (2 k) bits. The number of check bits associated with the 2k-bit segment may vary depending on the ECC algorithm. As a non-limiting example, in a Hamming code embodiment for one-bit correction and two-bit detection with 2 k-bits for a data segment, 16 check bits may be used to form a code-word comprising the data segment and the check bits. As a non-limiting example, in a BCH code embodiment with 2k-bits for a data segment, 32 check bits may be used to form a code-word comprising the data segment and the check bits. Some other non-limiting examples of information bits to check bits ratios are 64/8, 128/9, 256/10, 512/11, 1024/12, 2048/13, 4096/14, and 8192/15.

Figure 2:
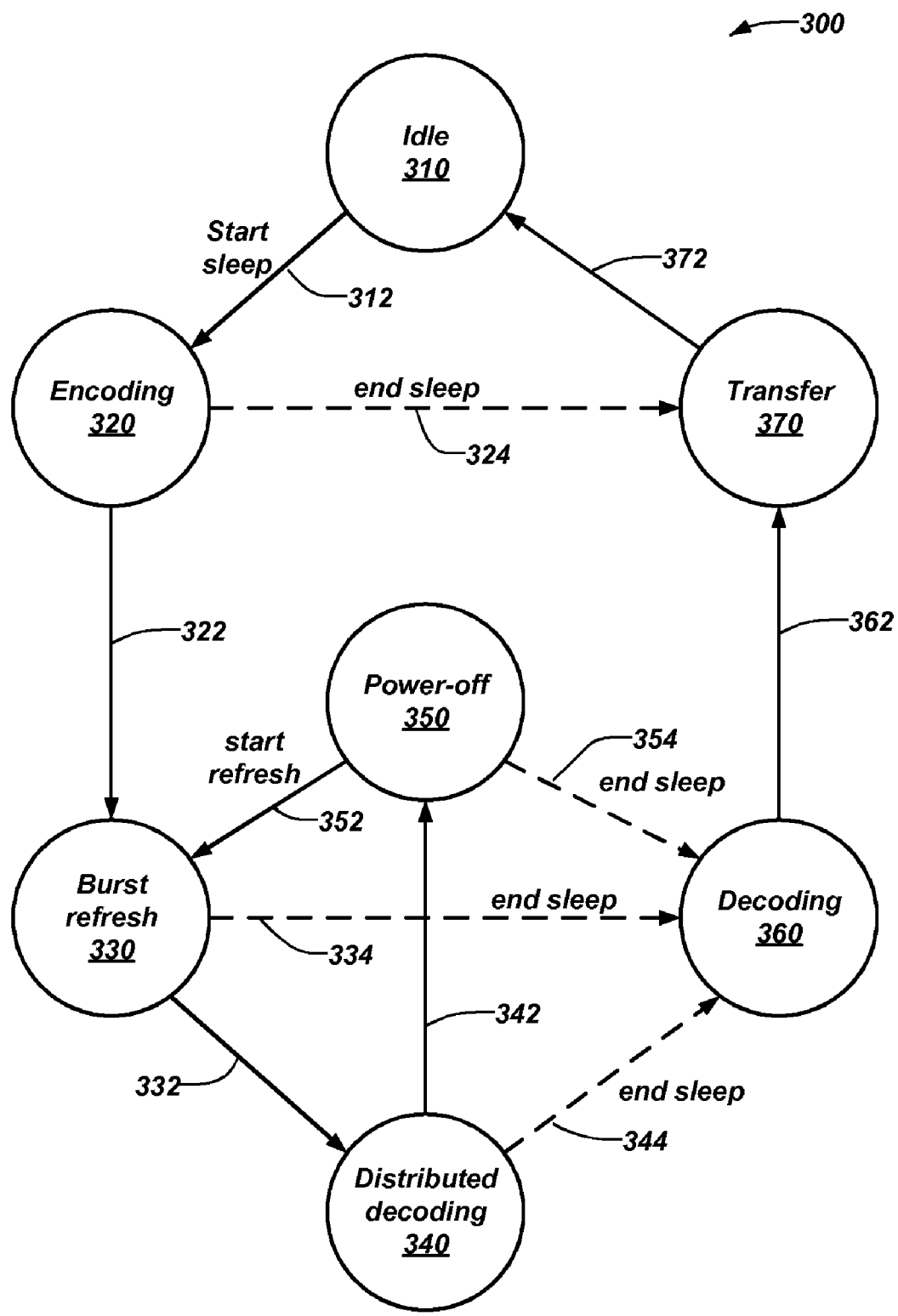
FIG. 2 is a state diagram illustrating states used in practicing embodiments of the present invention.
Figure 4:
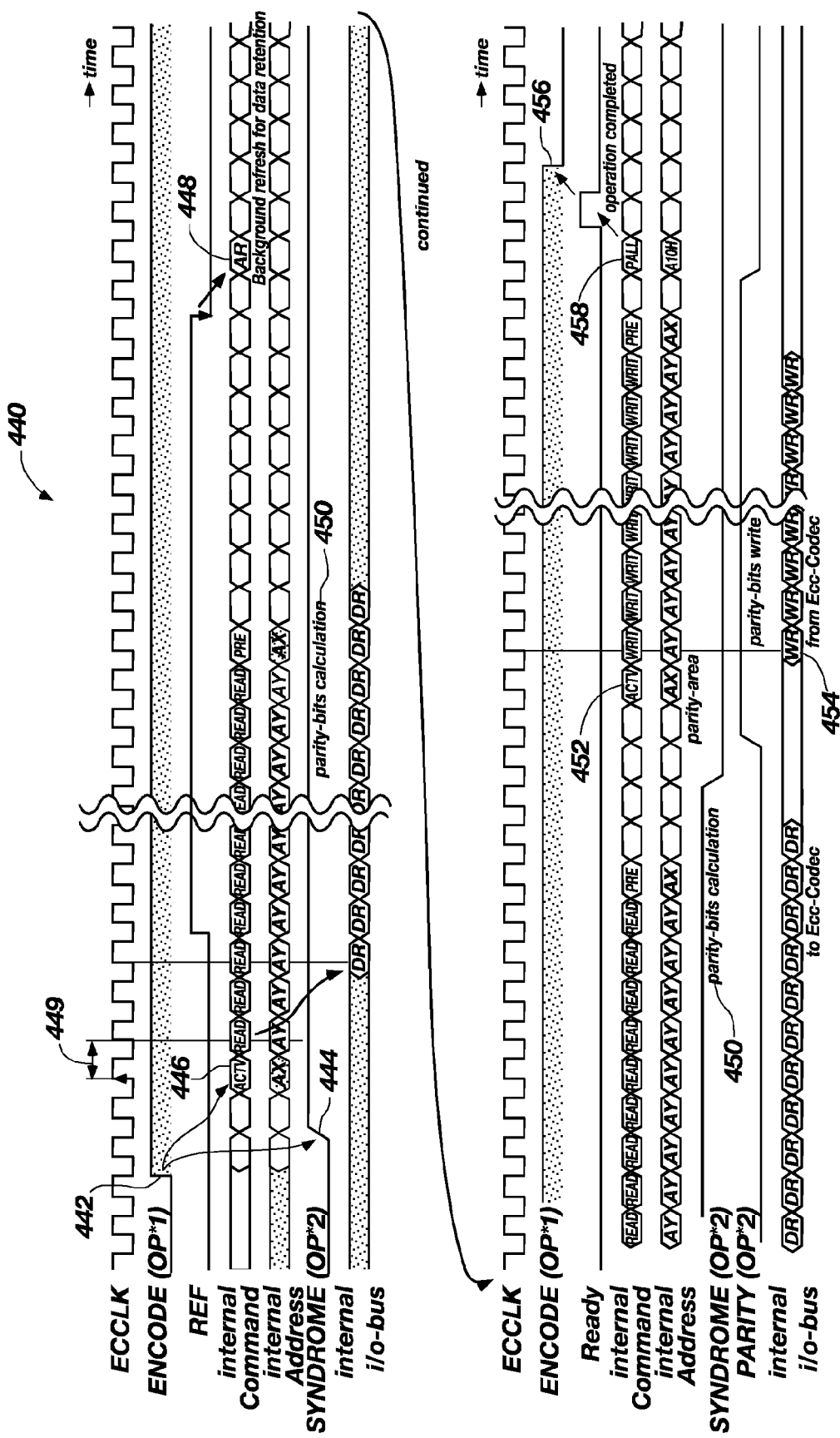
FIG. 4 is a timing diagram illustrating a portion of the operations performed to generate and store check bits as part of an error correcting code algorithm.
Figure 5:
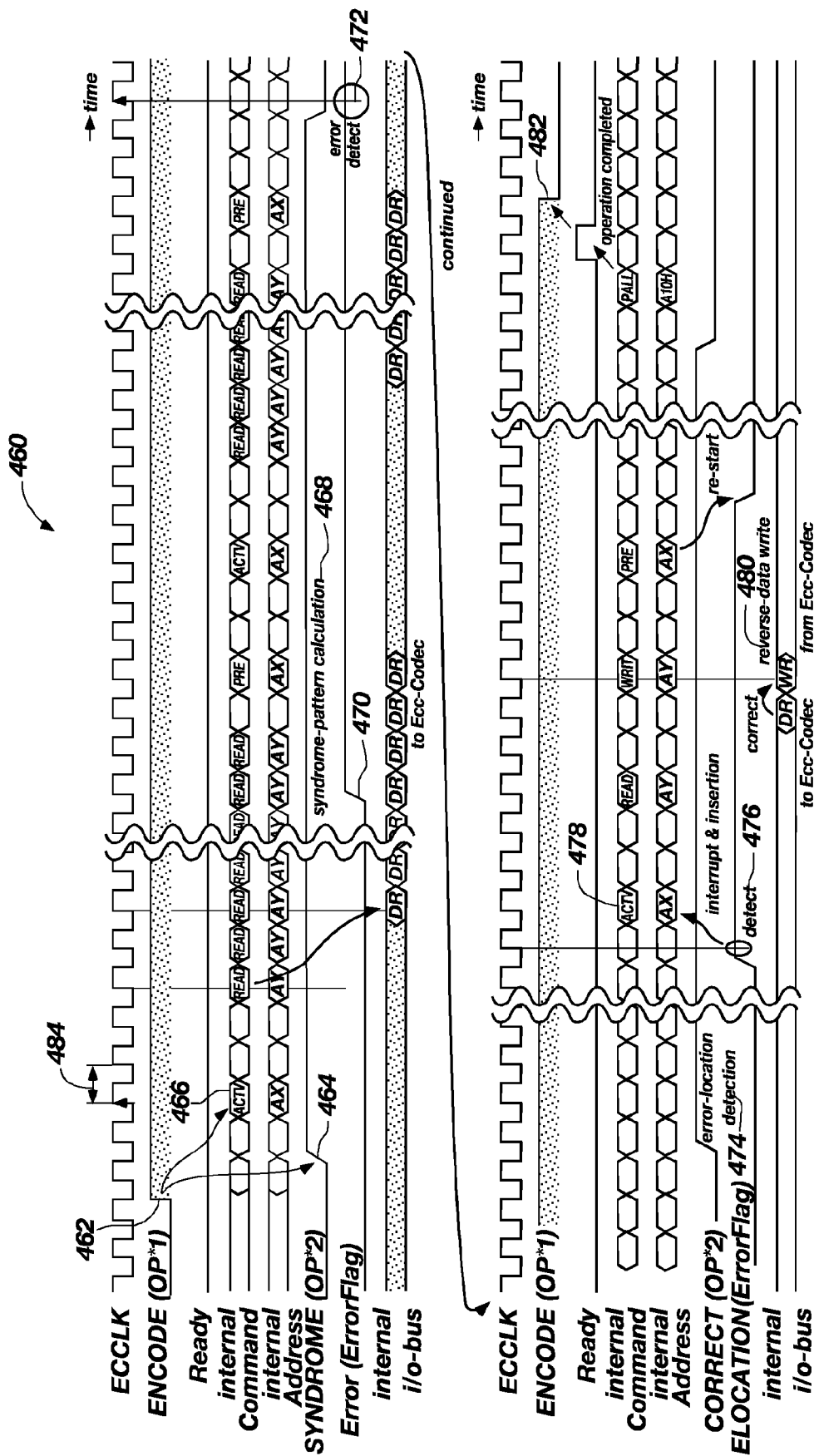
FIG. 5 is a timing diagram illustrating a portion of the operations performed to read and correct a potential error in a bit of a code-word as part of an error correcting code algorithm.

FIG. 2 is a state diagram illustrating states used by a state controller 260 (FIG. 1) in practicing embodiments of the present invention. This state diagram is intended to illustrate the basic states used in controlling different states of the sleep mode including burst refresh and ECC encoding and decoding. It does not show all details of various states that may be used in performing processes such as refresh cycles, read cycles, write cycles, and the like. Those of ordinary skill in the art will recognize that many other state machines may exist within a DRAM device and the sleep mode state controller may control or trigger other state machines. For example, the state controller may generate signals to an ECC controller 250 (FIG. 1), which may include a state machine for controlling the processes involved in generating addresses, command signals, and controlling data flow to carry out the ECC encoding and decoding processes. These states of the ECC controller 250, while not illustrated in state diagram form, will become apparent when discussing the ECC processes as shown in FIGS. 4 and 5.

Returning to the description of sleep mode, the DRAM device 100 of FIG. 1 includes a sleep controller 200. The sleep controller 200 includes a state controller 260, an ECC controller 250, and an ECC coder/decoder (codec) 210. The sleep controller 200 may also include oscillator circuits 220, a temperature sensor 230, and a power controller 240. The power controller 240 may be configured to control power to the DRAM device 100 by enabling and disabling various voltage generators 150, and various oscillator circuits 220, at various states during sleep mode as will become more apparent in the description of sleep mode and FIG. 3.

During sleep mode, the ECC controller 250 may issue commands on the internal command bus 252 and the internal address bus 254 to generate operations such as self-refresh cycles, data reads in support of ECC operations, data writes in support of ECC operations, and other commands associated with entering or leaving sleep mode. The ECC codec 210 may receive data from the arrays 110 during read cycles and deliver data during write cycles in support of ECC operations.

With reference to FIGS. 1 and 2, the sleep controller 200 includes the state controller 260 for performing the sleep mode state machine 300. The state machine 300 remains in an idle state 310 until a start sleep signal (may also be referred to as a first event or an initiation event) is asserted. This initiation event may be configured as an external command, such as, for example, the CKE 118 input signal being negated or other suitable command or signal. As a result of the initiation event, the state machine transitions 312 to an encoding state 320, where a full ECC encoding cycle is performed as is discussed more fully with reference to FIG. 4. After the ECC encoding cycle is complete, the state machine transitions 322 to a burst refresh state 330, where a burst refresh process is performed to refresh all the bits of the DRAM device. Under normal sleep-mode circumstances, after the burst refresh completes the state machine transitions 332 to a distributed decoding state 340. While in the distributed decoding state, the state controller 260 signals the ECC controller 250 to perform at least one distributed decoding process as is explained more fully with reference to FIG. 3. Under normal sleep-mode circumstances, after the distributed decoding process completes, the state machine transitions 342 to a power-off state 350 where power may be substantially removed from the DRAM arrays 110. After a predetermined time has elapsed, the state machine 300 receives a start refresh signal and the state machine 300 transitions 352 to the burst refresh state 330.

While in sleep mode, the state machine 300 will cycle between the burst refresh state 330, the distributed decoding state 340, and the power-off state 350, then wait for a new start refresh signal to begin the cycle again.

The state machine remains in this loop between states 330, 340, and 350 until an end sleep signal is asserted. The end sleep signal may also be referred to herein as a second event or a termination event. This termination event may be configured as an external command, such as, for example, the CKE 118 input signal being asserted or other suitable command or signal.

As can be seen in FIG. 2, transition 334 indicates a transition from the burst refresh state 330, transition 344 indicates a transition from the distributed decoding state 340, and transition 354 indicates a transition from the power-off state 350. From all these transitions, the state machine 300 enters a decoding state 360 where a full ECC decoding cycle may be performed. After the full ECC decoding cycle is complete, the state machine transitions 362 to a transfer state 370, where operations are performed to prepare the state machine to exit the sleep mode. After these operations are complete, the state machine transitions 372 back to the idle state 310 where normal DRAM operations can resume. Also of note, if the end sleep signal is asserted during the encoding state 320, the state machine transitions 324 to the transfer state 370 in preparation for returning to normal operation.

Figure 3:
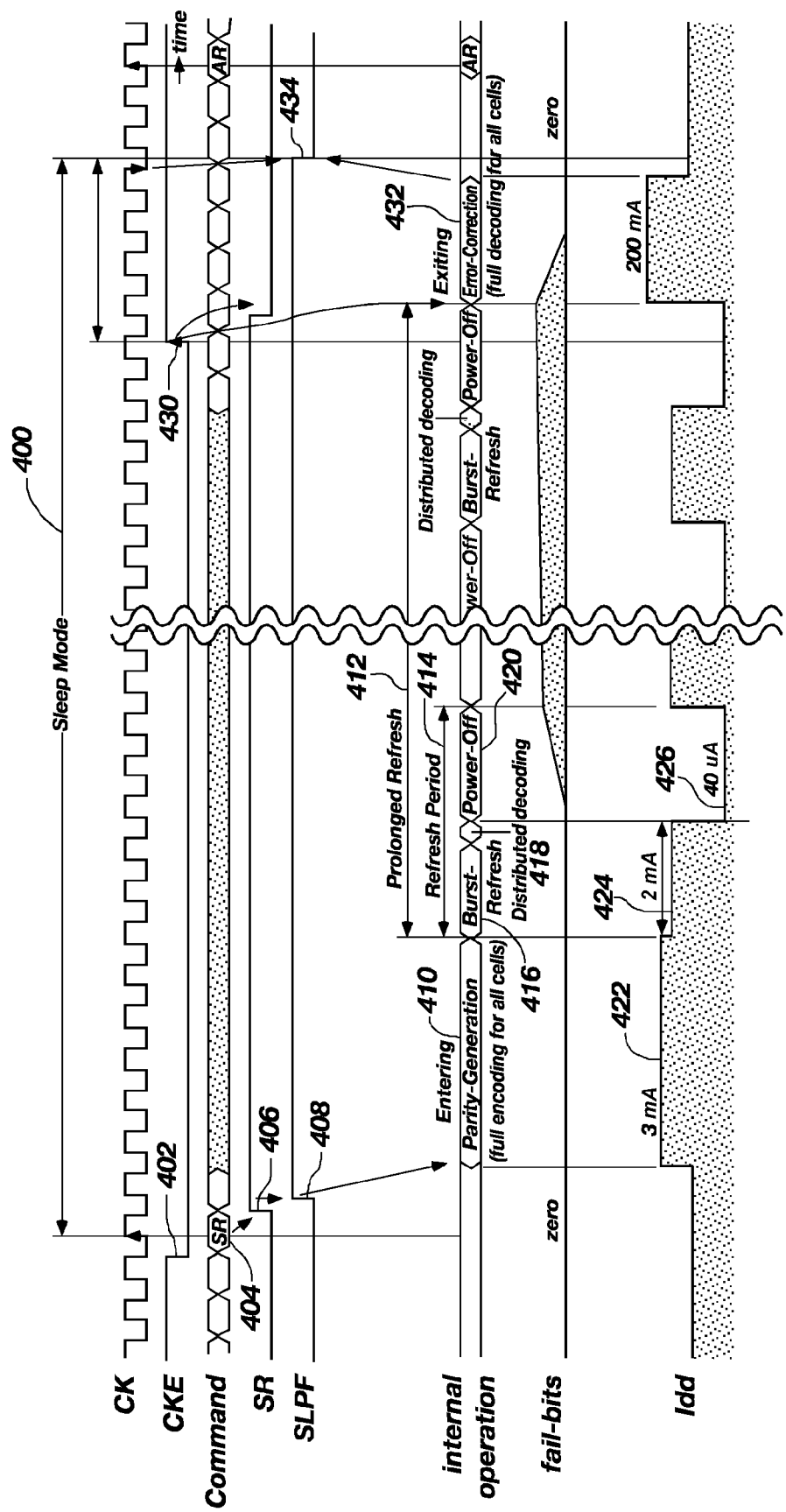
FIG. 3 is a timing diagram illustrating a portion of the operations performed during a low-power mode.

FIG. 3 is a timing diagram illustrating a portion of the operations performed during a low-power mode, which may also be referred to as a sleep mode 400 or a data-retention mode. While discussing the timing diagram of FIG. 3, reference will also be made to the states of FIG. 2 and the functional blocks of FIG. 1. Entry into the sleep mode begins when the CKE signal is negated 402. This initiation signal triggers a self-refresh (SR) command 404 on the command bus and causes the SR (self-refresh) signal to be asserted 406 and the SLPF (Sleep Flag) signal to be asserted 408. With SLPF asserted, the state machine enters the encoding state 320 where a full ECC encoding process is performed as indicated by "Parity-Generation" 410 on the internal operation signal. Parity generation will be more fully explained below when describing FIG. 4.

After parity generation is complete a prolonged refresh cycle 412 is entered, which comprises the burst refresh state 330, the distributed decoding state 340, and the power-off state 350 of FIG. 2. The burst refresh process 416 is shown in the internal operation signal of the timing diagram. After the burst refresh process 416 completes, a distributed decoding operation 418 is performed, which is explained more fully below when describing FIG. 5. After the distributed decoding operation 418 completes, the DRAM device enters a power-off period 420.

In the power-off state, the state controller may signal the power controller to disable power, via the voltage generators 150, to various functional blocks within the DRAM device 100. By way of example, and not limitation, power to the arrays 110, except for plate voltage, may be disabled. Furthermore, upon entry into sleep mode, power may be disabled, clocks may be disabled, or combinations thereof for other functional blocks on the DRAM device 100. For non-limiting examples, delay locked loops and phase locked loops may be disabled, input and output buffers may be disabled, and other functional blocks not needed during sleep mode may be disabled.

The IDD signal indicates examples of possible current that may be drawn during various sleep mode states. For example, parity generation current 422 may be about 3 mA, burst refresh current 424 may be about 2 mA, and power-off current 426 may be about 40 uA. Those of ordinary skill in the art will recognize that these current indications are non-limiting examples of possible currents for a specific embodiment.

The refresh period 414 is repeated until a termination event is detected. The refresh period 414 may be extended as was explained earlier responsive to temperature of the DRAM device 100. Furthermore, the refresh period 414 may be controlled by configuration registers (not shown) that define or modify the length of the refresh period during sleep mode and for other operational parameters such as temperature or supply voltage. The burst refresh process 416 and distributed decoding operation 418 have substantially the same time length for each repetition of the refresh period 414. Therefore, any change in the refresh period 414, means a change in the power-off period 420. By way of example, and not limitation, the burst refresh process 416 may take about 70 mS, the distributed decoding operation 418 may take about 40 uS, and the power off period may be about one to ten seconds.

Sleep mode begins an exit process upon detection of a termination event, which is illustrated as the CKE being asserted 430. At the detection of the termination event, an error-correction process 432 is performed, which is explained more fully during the description of FIG. 5. After completion of the error-correction process 432, the SLPF is negated 434 and the sleep mode exits. By way of example, and not limitation, the sleep mode may last for hours or more. At some point, if sleep mode is too short there may be little or no power savings due to the power requirements of performing the full encoding process 410 and the full decoding process 432. As a non-limiting example, a sleep mode of ten minutes or more should save power.

FIG. 4 is a timing diagram illustrating a portion of the operations performed to generate and store check bits as part of the ECC encoding cycle 440. During the encoding cycle, the internal command and internal address bus are controlled by the ECC controller and the data is read or written by the ECC codec. The signal ENCODE(OP*1) is asserted 442 to indicate the beginning of the ECC encoding cycle 440. SYN- DROME(OP*2) is asserted 444 to indicate the beginning of the parity bit calculation process and an internal command (ACTV) is issued 446 to activate a row and begin reading the column data associated with that row. The read data (DR on the internal I/O bus) is fed to the ECC codec for parity bit calculation 450. Depending on the size of the data block that is to be encoded, as was explained earlier, this read process may be repeated. A refresh 448 (AR on the internal command bus) may occur during the encoding process to ensure that data is retained during the encoding. After all the data has been read for the data block to be encoded, one or more write cycles are performed to write the parity bits to the arrays. An internal command (ACTV) is issued 452 to activate a row and begin writing the parity data 454 associated with that row. Depending on the size and configuration of the parity data in the arrays, this write cycle may be repeated to write additional parity bits.

The process of reading out a data block, calculating the parity bits, and writing the parity bits for that block to the arrays, is repeated until all of the data blocks (i.e., code-words) for the DRAM device have been encoded. Then the encoding process completes, as is indicated by the negation 456 of the ENCODE(OP*1) signal. As part of the completion of the encoding cycle a pre-charge all (PALL) command 458 may be issued. It should be noted that since the encoding is performed during the sleep mode, it may save power to perform the encoding at a slower clock period. Thus, the clock period 449 may be lengthened during the encoding process. As a non-limiting example, the clock period may be set at about 200 nS. With a slow clock, as a non-limiting example, the encoding process may take about 30 seconds.

FIG. 5 is a timing diagram illustrating a portion of the operations performed to read and correct a potential error in a bit of a code-word as part of a partial ECC decoding cycle or a full ECC decoding cycle. During decoding cycles 460, the internal command and internal address bus are controlled by the ECC controller and the data is read or written by the ECC codec. The signal DECODE(OP*1) is asserted 462 to indicate the beginning of the ECC decoding cycle 460. SYNDROME(OP*2) is asserted 464 to indicate the beginning of the syndrome pattern calculation process and an internal command (ACTV) is issued 466 to activate a row and begin reading the column data associated with that row. This column data will include both the information bits and the check bits to calculate the syndrome. The read data (DR on the internal I/O bus) is fed to the ECC codec for syndrome pattern calculation 468. Depending on the size of the data block that is to be decoded, as was explained earlier, this read process may be repeated. If an error is detected during the syndrome pattern calculation 468, an error flag is asserted 470. After all data has been read for the current code-word, if the error flag is asserted, then an error has been detected 472.

If the error detection process indicates an error has been detected 472, CORRECT(OP*2) is asserted 474 to indicate the start of an error location process. Elocation is asserted 476 if the error could be properly located. With a properly detected and located error, a correcting write is performed at the location of the error. An internal command (ACTV) is issued 478 to activate the proper row and begin reading the proper column associated with the error location. The data is read, the erroneous bit is flipped, and the data with the correct bit is written back as indicated by the reverse-data write 480. The encoding process completes as is indicated by the negation 482 of the DECODE(OP*1) signal. If an error is not indicated, the error location process 474 and the reverse-data write 480 may be skipped for the current code-word. If the error location is not successfully found, the reverse-data write 480 may be skipped for the current code-word.

If the decoding process is a partial decode associated with the distributed decoding that occurs during the prolonged refresh, the partial decode may be performed on a single code-word, or a subset of all the code-words. On each subsequent partial decode, a different code-word is decoded, and repaired if needed. Control of sequencing through the code-words and how many code-words are decoded for each refresh period may be predetermined or may be controlled by configuration registers (not shown). It should be noted that since the partial decoding is performed during sleep mode, it may be advisable to run the clock slow to reduce power consumption. Therefore, the decoding may be performed with a slow clock period. Thus, the clock period 484 may be lengthened during the partial decoding process. The clock period, as a non-limiting example, may be set at about 200 nS.

If the decoding process is a full decode that is performed prior to exiting sleep mode, the process of syndrome pattern calculation, error location if needed, and error correction if needed, is repeated for each code-word until all the code-words have been decoded. It should be noted that since the decoding is performed prior to exiting sleep mode, it may be advisable to exit sleep mode as quickly as possible. Therefore, the decoding may be performed with a fast clock period. Thus, the clock period 484 may be shortened during the full decoding process. As a non-limiting example, the clock period may be set at about 10 nS. As a non-limiting example, with a fast clock the full decoding process may take about 500 mS.

Figure 6:
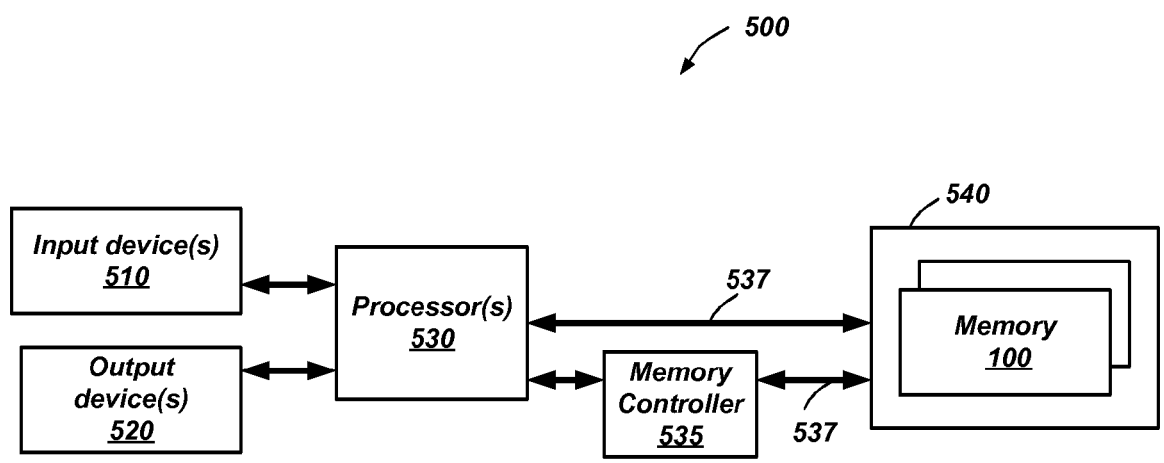
FIG. 6 is a simplified system block diagram of a computing system using a DRAM device incorporating an embodiment of the present invention.

FIG. 6 is a simplified system block diagram of a computing system using a DRAM device incorporating an embodiment of the present invention. As shown in FIG. 6, an electronic system 500, in accordance with the present invention, comprises at least one input device 510, at least one output device 520, at least one processor 530, and at least one memory device 540. The electronic system 500 may also include a memory controller 535. The memory device 540 comprises at least one semiconductor memory 100 incorporating an embodiment of the data-retention apparatus and method described herein in a DRAM device. The memory device 540 may be operated with control signals 537, which may include, for example, controls, commands, addresses and data. The control signals 537 may be in communication with the processor(s) 530, the memory controller 535, or combinations thereof.

Although the present invention has been described with reference to particular embodiments, the present invention is not limited to these described embodiments. Rather, the present invention is limited only by the appended claims, which include within their scope all equivalent devices or methods that operate according to the principles of the present invention as described.

What is claimed is:

1. A method of operating a volatile memory, the method comprising:
   refreshing a plurality of data bits of a volatile memory at a rate during a sleep mode that is slower than a normally specified rate during a normal operational mode;
   checking a portion of the plurality of data bits for errors during the sleep mode;
   correcting errors if identified during the checking the portion of the plurality of data bits for errors;
   checking substantially all of the plurality of data bits for errors responsive to a command for exiting the sleep mode; and correcting errors if identified during the checking substantially all of the plurality of data bits for errors.

2. The method of claim 1, further comprising:
receiving a start sleep signal to enter the sleep mode; and
receiving an end sleep signal to exit the sleep mode and enter the normal operation mode.

3. The method of claim 2, wherein receiving the start sleep signal and the end sleep signal each includes receiving an external input signal from at least one signal pin of the volatile memory.

4. The method of claim 1, wherein refreshing the plurality of data bits of the volatile memory during the sleep mode at a rate that is slower than a normally specified rate during the normal operational mode comprises determining a temperature of the volatile memory with a temperature sensor, and adjusting a refresh rate as a function of the temperature.

5. The method of claim 1, further comprising utilizing an ECC encoding cycle responsive to a command for entering the sleep mode.

6. The method of claim 5, wherein checking comprises utilizing an ECC check cycle code that is selected from the group consisting of Hamming code, BCH (Bose, Ray-Chaudhuri, Hocquenghem) code, Reed-Solomon code, Reed-Muller code, Binary Golay code, convolutional code, and turbo code.

7. The method of claim 1, wherein each of the combined acts of checking and correcting comprises:
designating at least one data word upon entering the sleep mode, the at least one data word comprising a subset of the plurality of data bits of the volatile memory;
storing a code-word corresponding to each data word as a stored code-word, the stored code-word comprising a plurality of check bits of the volatile memory, each of the plurality of check bits calculated as a parity of a different subset of the plurality of data bits from the corresponding data word;
recalculating the code-word as a recalculated code-word; and
comparing the stored code-word to the recalculated code-word to identify errors.

8. The method of claim 7, wherein a ratio of a number of the data bits in the at least one data word to a number of the check bits in each corresponding code-word is selected from the group consisting of 64/8, 128/9, 256/10, 512/11, 1024/12, and 2048/13.

9. The method of claim 1, wherein the combined acts of checking and correcting errors identified in the portion of the plurality of data bits comprise cycling through a plurality of states according to a state machine, the state machine transitioning between a burst refresh state, a distributed decoding state, and a power off state while in the sleep mode.

10. The method of claim 9, wherein the power off state includes disabling power to functional blocks within the volatile memory.

11. The method of claim 9, wherein the burst refresh state includes refreshing all bits of the volatile memory.

12. The method of claim 9, wherein the distributed decoding state is performed on a subset of all code-words per cycle.

13. The method of claim 9, wherein the distributed decoding state is performed on a single code-word per cycle.

14. The method of claim 13, wherein the single code-word of a given cycle is different than the single code-word of an immediately previous cycle.

15. The method of claim 9, the state machine further transitioning to a full decoding state prior to exiting the sleep mode.

16. The method of claim 15, wherein checking substantially all of the plurality of data bits for errors responsive to a command for exiting the sleep mode, and correcting errors if identified during the checking substantially all of the plurality of data bits for errors occurs during the full decoding state.

17. The method of claim 15, wherein transitioning to a full decoding state occurs responsive to receiving the command for exiting the sleep mode during one of the burst refresh state, the distributed decoding state, and the power off state.

18. A method of operating a volatile memory, the method comprising:
performing an ECC encoding cycle for a plurality of bits of a volatile memory responsive to a command for entering a low-power operation mode;
performing a refresh operation during the low-power operation mode at a rate that is less than a normally specified rate for a higher-power operation mode;
performing an ECC decoding cycle for a subset of the plurality of bits during the low-power operation mode; and
performing an ECC decoding cycle for the plurality of bits responsive to a command for exiting the low-power operation mode.

19. The method of claim 18, wherein performing an ECC decoding cycle for the plurality of bits responsive to a command for exiting the low-power operation mode is performed at a fast clock period that is relatively faster than a slow clock period for the low-power mode.

20. The method of claim 18, further comprising reducing power to the volatile memory during the low-power operation mode.

21. The method of claim 20, further comprising sequencing between the acts of performing the refresh operation, performing the ECC decoding cycle for a subset of the plurality of bits, and reducing power to the volatile memory during the low-power operation mode prior to receiving the command for exiting the low-power operation mode.

22. The method of claim 18, wherein performing the ECC encoding cycle for the plurality of bits comprises:
dividing the plurality of bits into a plurality of data words, the plurality of data words comprising a plurality of data bits; and
storing a code-word corresponding to each data word, the code-word comprising a plurality of check bits, each of the plurality of check bits calculated as a function of a different subset of the plurality of data bits from the corresponding data word.

23. The method of claim 22, wherein performing an ECC decoding cycle for the subset of the plurality of bits comprises:
recalculating a subset of the code-words; and
comparing the recalculated code-words to the subset of the stored code-words to identify errors.

24. The method of claim 23, wherein performing an ECC decoding cycle for the subset of the plurality of bits further comprises correcting the identified errors.

25. The method of claim 22, wherein performing the ECC decoding cycle for the plurality of bits comprises:
recalculating substantially all of the code-words; and
comparing a recalculated subset of code-words to a corresponding subset of stored code-words to identify errors.

26. The method of claim 25, wherein performing the ECC decoding cycle for the plurality of bits further comprises correcting the identified errors.

27. An apparatus, comprising:
a memory array; and
a sleep mode controller operably coupled with the memory array, wherein the sleep mode controller is configured to:
- perform an ECC encoding cycle for a plurality of bits of the memory array responsive to initiating entering a low-power operation mode;
- refresh the plurality of bits during the low-power operation mode at a refresh rate that is slower than a normally specified rate;
- perform a partial ECC decoding cycle for a subset of the plurality of bits during the low-power operation mode; and
- perform a full ECC decoding cycle for a substantial portion of the plurality of bits responsive to initiating exiting the low-power operation mode.

28. The apparatus of claim 27, further comprising a memory device that includes the memory array and the sleep mode controller.

29. The apparatus of claim 28, further comprising:
an input device;
an output device; and
a processor operably coupled with the input device, the output device, and the memory device, the processor for communicating control signals to the memory device.

30. The apparatus of claim 27, further comprising a memory controller operably coupled with the processor and the memory device, the memory controller for communicating with the memory device.

31. The apparatus of claim 30, wherein the memory device comprises a temperature sensor for measuring a temperature of the memory device and communicating the temperature to the memory controller to responsively modify the refresh rate of the memory device as a function of temperature.

* * * * *